United States Patent
Momikura

(10) Patent No.: US 9,786,538 B2
(45) Date of Patent: Oct. 10, 2017

(54) ATTACHMENT MEMBER AND ATTACHMENT DEVICE USING THE SAME

(71) Applicant: KYOCERA Corporation, Kyoto (JP)

(72) Inventor: Hiroyasu Momikura, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 142 days.

(21) Appl. No.: 14/655,318

(22) PCT Filed: Dec. 13, 2013

(86) PCT No.: PCT/JP2013/083171
§ 371 (c)(1),
(2) Date: Jun. 24, 2015

(87) PCT Pub. No.: WO2014/103714
PCT Pub. Date: Jul. 3, 2014

(65) Prior Publication Data
US 2015/0357220 A1    Dec. 10, 2015

(30) Foreign Application Priority Data

Dec. 25, 2012 (JP) ................. 2012-281259

(51) Int. Cl.
H01L 21/683    (2006.01)
H01L 21/687    (2006.01)
C23C 14/04    (2006.01)

(52) U.S. Cl.
CPC .......... *H01L 21/683* (2013.01); *C23C 14/042* (2013.01); *H01L 21/6875* (2013.01); *H01L 21/68757* (2013.01)

(58) Field of Classification Search
CPC .......... H01L 21/6833; H01L 21/6831
(Continued)

(56) References Cited

U.S. PATENT DOCUMENTS 6,307,620 B1    10/2001    Takabayashi et al.
2009/0056112 A1    3/2009    Kobayashi
(Continued)

FOREIGN PATENT DOCUMENTS

JP    47-43863 B1    11/1972
JP    2006-064992 A    3/2006
(Continued)

OTHER PUBLICATIONS

JP-2012-119378; Entire Document, figures, specification.*
(Continued)

*Primary Examiner* — Dharti Patel
(74) *Attorney, Agent, or Firm* — Procopio, Cory, Hargreaves & Savitch LLP

(57) ABSTRACT

An attachment member (1) according to an embodiment of the present invention includes: a base (4) composed of a ceramic sintered body, which has an annular part (6) corresponding to a shape of an object (2), a bottom surface (7) located inside the annular part (6), and a plurality of column shaped protruding parts (8) protruding from the bottom surface (7), and is provided with an attachment surface (3) supporting and attaching the object (2) inside the annular part (6) by a plurality of the protruding parts (8); and a film (5) that covers at least a part of the bottom surface (7), exposes top surfaces (11) of the protruding parts (8), and has higher hydrophilicity than the base (4). Accordingly, it is possible to provide the attachment member (1) that is excellent in attachment force for the object (2), and suppresses contamination of the object (2).

11 Claims, 6 Drawing Sheets

(58) Field of Classification Search
USPC .......................................................... 361/234
See application file for complete search history.

(56) References Cited

U.S. PATENT DOCUMENTS

| | | |
|---|---|---|
| 2010/0096262 A1 | 4/2010 | Aruga et al. |
| 2010/0236476 A1 | 9/2010 | De Jong |
| 2010/0265486 A1 | 10/2010 | De Jong |
| 2012/0147353 A1 | 6/2012 | Lafarre et al. |

FOREIGN PATENT DOCUMENTS

| | | |
|---|---|---|
| JP | 2009-060035 A | 3/2009 |
| JP | 2009-272646 A | 11/2009 |
| JP | 2012-119378 A | 6/2012 |
| JP | 2012-518900 A | 8/2012 |
| WO | 2009/011574 A1 | 1/2009 |
| WO | 2010/094800 A1 | 2/2010 |
| WO | 2010/094748 A1 | 8/2010 |

OTHER PUBLICATIONS

JP-47-43863; Entire document.*
Office Action dated Nov. 15, 2016 issued by the Japan Patent Office in Counterpart Japanese Application No. 2014-554302, 3 pgs.
Extended European Search Report dated Aug. 17, 2016 issued by the European Patent Office for Counterpart European Application No. 13 868 287.7.
International Search Report dated Jan. 14, 2014, issued for International Application No. PCT/JP2013/083171.

* cited by examiner

ATTACHMENT MEMBER AND ATTACHMENT DEVICE USING THE SAME

TECHNICAL FIELD

The present invention relates to an attachment member that attaches an object such as a wafer and a glass substrate when the object is subjected to treatment, in a process of manufacturing a semiconductor integrated circuit or a liquid crystal display, for example, and an attachment device using the same.

BACKGROUND ART

Conventionally, in a process of manufacturing a semiconductor integrated circuit or a liquid crystal display, an object such as a wafer and a glass substrate is subjected to treatment such as exposure and grinding by various devices such as an exposure device and a grinding device. At this time, the object is attached to an attachment member.

As this attachment member, for example, JP 2012-518900 W describes a substrate supporting structure (attachment member) for clamping a substrate (object) by capillary force generated by liquid such as water, the substrate supporting structure including a surface (attachment surface) provided with a plurality of substrate supporting elements (protruding parts) for holding the substrate (object).

In such an attachment member, when hydrophilicity of the attachment surface is low, bubbles are generated in the liquid, so that attachment force for the object is easily lowered. On the other hand, when abrasion resistance of the protruding parts is low, particles are generated from the protruding parts by contact with the object, so that the object is easily contaminated.

SUMMARY OF THE INVENTION

The present invention responds to a request for providing an attachment member that is excellent in attachment force for an object, and suppresses contamination of the object.

An attachment member according to an embodiment of the present invention includes a base composed of a ceramic sintered body, which has an annular part corresponding to a shape of an object, a bottom surface located inside the annular part, and a plurality of column shaped protruding parts protruding from the bottom surface, and is provided with an attachment surface supporting and attaching the object inside the annular part by a plurality of the protruding parts. Furthermore, the attachment member includes a film that covers at least a part of the bottom surface with top surfaces of the protruding parts exposed, and has higher hydrophilicity than the base.

An attachment member according to an embodiment of the present invention includes a base composed of a ceramic sintered body, which has an annular part corresponding to a shape of an object, a bottom surface located inside the annular part, and a plurality of column shaped protruding parts protruding from the bottom surface, and is provided with an attachment surface supporting and attaching the object inside the annular part by a plurality of the protruding parts. Furthermore, the attachment member includes a film that covers at least a part of the bottom surface with top surfaces of the protruding parts exposed, and is composed of silicon or silicon oxide.

According to the attachment member of an embodiment of the present invention, the film having higher hydrophilicity than the base covers at least the part of the bottom surface of the attachment surface, and therefore it is possible to enhance attachment force for the object. Furthermore, the top surfaces of the protruding parts of the base composed of the ceramic sintered body are exposed from the film, and therefore it is possible to suppress generation of particles in the protruding parts. Accordingly, it is possible to provide the attachment member that is excellent in attachment force for the object, and suppresses contamination of the object.

According to the attachment member of an embodiment of the present invention, the film composed of silicon or silicon oxide covers at least the part of the bottom surface of the attachment surface, and therefore it is possible to enhance attachment force for the object. Furthermore, the top surfaces of the protruding parts of the base composed of the ceramic sintered body are exposed from the film, and therefore it is possible to suppress generation of particles in the protruding parts. Accordingly, it is possible to provide the attachment member that is excellent in attachment force for the object, and suppresses contamination of the object.

PREFERRED EMBODIMENTS OF FOR CARRYING OUT THE INVENTION

<First Embodiment>

Hereinafter, an attachment member according to a first embodiment of the present invention is described in detail with reference to FIG. 1 to FIG. 3.

Figure 1:
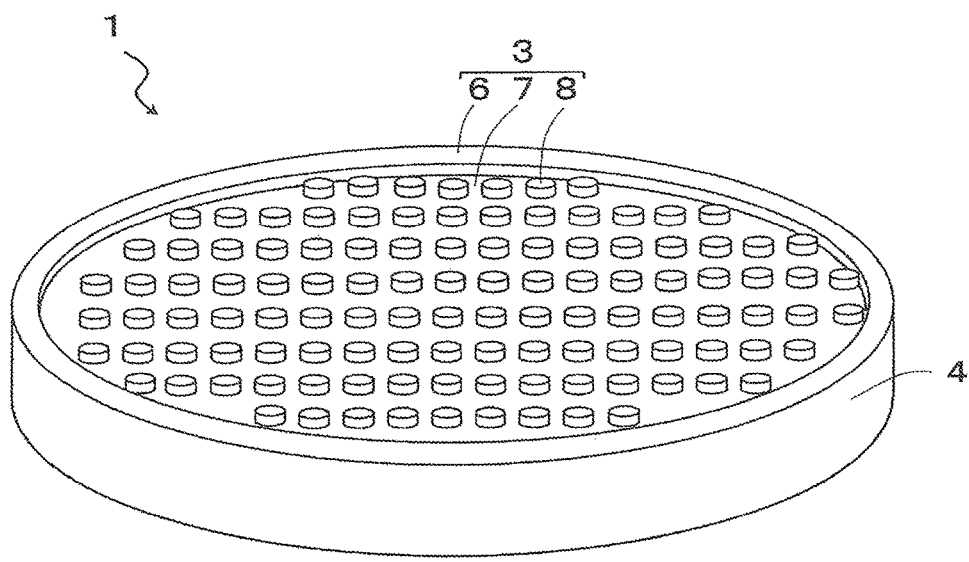
FIG. 1 is a perspective view of an attachment member according to a first embodiment of the present invention.
Figure 2A:
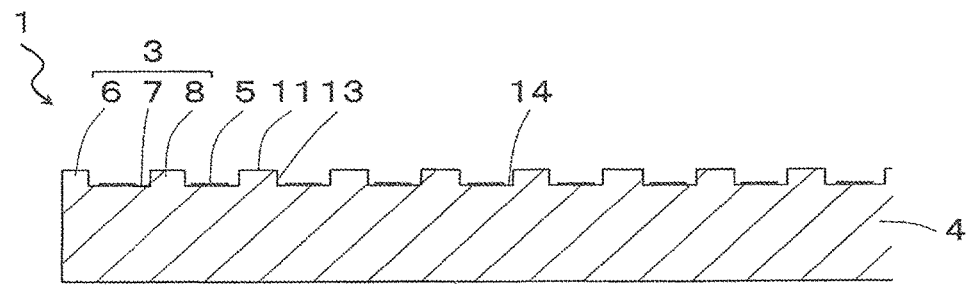
FIG. 2(a) is a partial enlarged view of a sectional view in which the attachment member in FIG. 1 is cut in a thickness direction.
Figure 2B:
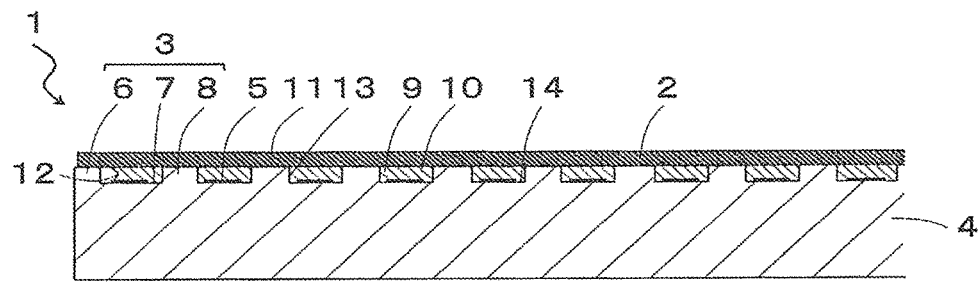
FIG. 2(b) is a diagram illustrating a state where the attachment member in FIG. 2(a) attaches an object.

The attachment member 1 illustrated in FIG. 1 and FIG. 2 is a member that attaches an object 2 being a disk-shaped silicon wafer in various devices such as an exposure device and a grinding device used in a process of manufacturing a semiconductor integrated circuit. The object 2 attached to the attachment member 1 is subject to various treatment in the various devices. For example, the exposure device includes the attachment member 1 and a light source. This exposure device applies light from the light source to the object 2 attached to the attachment member 1, so that the object 2 is exposed, and a wiring pattern is formed. The object 2 may be a wafer other than the silicon wafer, and may be, for example, a SiC wafer. Additionally, the attachment member 1 may be used in a process of manufacturing a liquid crystal display. In this case, as the object 2, a rectangular plate-like glass substrate is used.

As illustrated in FIG. 1 to FIG. 3, the attachment member 1 of this embodiment includes a base 4 having an attachment surface 3 that attaches the object 2, a film 5 that covers at least a part of the attachment surface 3, and a flow passage (not illustrated) penetrating the base 4 to be connected to a liquid supply member. The liquid supply member and the attachment member 1 configure an attachment device that attaches the object 2.

The base 4 of attachment member 1 is composed of a ceramic sintered body. As this ceramic sintered body, various ceramic sintered bodies can be used. Among these, an alumina sintered body or a silicon carbide sintered body is desirably used, from a viewpoint of abrasion resistance. A contact angle of a base 4 composed of the ceramic sintered body and water is, for example, not less than 30° and not more than 80°. A contact angle of a base 4 composed of the alumina sintered body and water is, for example, about 50°. A contact angle of a base 4 composed of silicon carbide sintered body and water is, for example, about 60°. The contact angle of the base 4 and water is measured by a method complying with JISR 3257: 1999, by using, for example, a contact angle meter manufactured by KRUSS GmbH.

The shape of the base 4 corresponds to, for example, the shape of the object 2, and is a disk-shape in this embodiment. The thickness of this base 4 is, for example, not less than 5 mm and not more than 15 mm. Additionally, the width (diameter) of the base 4 is, for example, not less than 200 mm and not more than 500mm.

As illustrated in FIG. 1 to FIG. 3, the attachment surface 3 of the base 4 has an annular part 6 corresponding to the shape of the object 2, a bottom surface 7 located inside the annular part 6, and protruding parts 8 that protrude from the bottom surface 7. This attachment surface 3 supports and attaches the object 2 inside the annular part 6 by a plurality of the protruding parts 8. The object 2 is attached by liquid 10 supplied to a space 9 formed between the attachment surface 3 and the object 2, as described later.

The annular part 6 functions as a seal member that seals the space 9 to suppress evaporation of the liquid 10. This annular part 6 is an annular projecting part that surrounds the bottom surface 7 at the outer edge of the attachment surface 3, and has an annular shape in this embodiment. The annular part 6 comes into contact with the object 2, so that the evaporation of the liquid 10 may be suppressed. Alternatively, a minute clearance is formed between the object 2 and the annular part 6, so that the evaporation of the liquid 10 may be suppressed.

The bottom surface 7 is separated from the object 2 supported by the protruding parts 8, and forms the space 9 between the object 2 and the bottom surface 7. This bottom surface 7 is disposed between the protruding parts 8 inside the annular part 6. The bottom surface 7 may be flat, or may have a step.

The protruding parts 8 each support the object 2 at a top surface 11. The protruding parts 8 protrude from the bottom surface 7 inside the annular 6. The protruding parts 8 of this embodiment each have a cylindrical shape. The height of each of the protruding parts 8 is, for example, not less than 3 μm and not more than 10 μm. Additionally, the width (diameter) a top surface of each protruding part 8 is, for example, not less than 10μm and not more than 500μm.

Additionally, the pitch of the protruding parts 8 is, for example, not less than 1 mm and not more than 5 mm. Each protruding part 8 may have a columnar shape, and may have, for example, a polygonal columnar shape such as a square pole.

The film 5 covers at least a part of the bottom surface 7 in the attachment surface 3, and exposes the top surfaces 11 of the protruding parts 8. This film 5 is directly adhered to the bottom surface 7, and is exposed to the space 9. Then, the film 5 is in contact with the liquid 10.

The film 5 is composed of a film having higher hydrophilicity than the base 4. Such a film 5 is desirably composed of silicon or silicon oxide. Generally, a contact angle of silicon or silicon oxide and water is smaller than the contact angle of the ceramic sintered body and water, and silicon and silicon oxide each have smaller hydrophilicity than the ceramic sintered body, and therefore the hydrophilicity of the film 5 can be made higher than the hydrophilicity of the base 4. Particularly, the film 5 composed of silicon oxide is used, so that it is possible to make the hydrophilicity of the film 5 higher. A contact angle of the film 5 composed of silicon oxide and water is, for example, about 20°. The contact angle of the film 5 and water is measured by a method similar to the above method for measuring the contact angle of the base 4 and water. In a case where the film 5 is composed of silicon, the surface of the film 5, which is exposed to the space 9, may be oxidized.

Any film 5 may be used as long as the film 5 has higher hydrophilicity than the base 4, and the film 5 may be composed of a material other than silicon or silicon oxide. In this case, the film 5 is desirably composed of an inorganic substance. As a result, in a case where the film 5 composed of the inorganic substance is used, it is possible to further suppress abrasion of the film 5, or to further suppress peeling between the film 5 and the attachment surface 3, compared to a case where the film 5 is composed of an organic substance. Consequently, it is possible to suppress generation of particles, and therefore it is possible to suppress contamination of the object 2. Furthermore, as the film 5, a material composed of inorganic oxide is desirably used. As a result, oxide generally has high hydrophilicity, and therefore the hydrophilicity of the film 5 can be made higher.

The thickness of the film 5 is smaller than the height of each of the protruding parts 8. As a result, the space 9 is formed between the film 5 covering the bottom surface 7 of the attachment surface 3, and the object 2 supported by the protruding parts 8. The thickness of such a film 5 is, for example, not less than 0.5μm and not more than 2μm.

For example, the attachment of the object 2 by the attachment member 1, described above, is performed as follows. First, the object 2 is placed on the attachment surface 3, and the object 2 is supported by the top surfaces 11 of the protruding parts 8. At this time, the space 9 between the attachment surface 3 and the object 2 is formed. Then, the liquid 10 is supplied from the liquid supply member to the space 9 through the flow passage, and the liquid 10 is brought into contact with both the film 5 on the bottom surface 7 and the object 2. When a contact angle of the liquid 10 and the film 5, and a contact angle of the liquid 10 and the object 2 are small, the film 5 and the object 2 easily get wet by the liquid 10, and therefore the side surface 12 of the liquid 5 is formed in a concave shape recessed from the outside toward the inside of the liquid 10. The object 2 is attached to the attachment surface 3 by surface tension of this concave shaped side surface 12. When the object 2 is desorbed from the attachment surface 3, for example, the liquid 10 is discharged from the space 9 through the flow passage.

Thus, in order to attach the object 2, as the liquid 10, water is desirably used. The contact angle of water and silicon or silicon oxide is small, and therefore a contact angle of the object 2 being a silicon wafer or a glass substrate and the liquid 10 can be sufficiently reduced, and the object 2 can be attached by the attachment member 1. As the liquid 10, liquid having high hydrophilicity other than water can be used. For example, alcohol having a hydroxyl group such as glycol, ethanol, and ethylene glycol may be used.

Additionally, the height of space 9 is set to be minute such that the side surface 12 of the liquid 10 has the concave shape. For example, the height of space 9 is not less than 3μm and not more than 10μm. The height of each protruding part 8 and the thickness of the film 5 are appropriately set, so that the height of the space 9 can be adjusted.

Herein, as illustrated in FIG. 2 and FIG. 3, the attachment member 1 of this embodiment includes the film 5 that covers at least a part of the bottom surface 7, exposes the top surfaces 11 of the protruding parts 8, and has higher hydrophilicity than the base 4.

As a result, the film 5 having higher hydrophilicity than the base 4 covers at least the part of the bottom surface 7, and therefore it is possible to suppress generation of bubbles in the liquid 10 supplied to the space 9. Therefore, it is possible to suppress reduction in attachment force for the object 2 due to the bubbles. Furthermore, the top surfaces 11 of the protruding parts 8 of the base 4 are exposed from the film 5, and the top surfaces 11 of the protruding parts 8 are composed of the ceramic sintered bodies, and therefore abrasion resistance of the top surfaces 11 of the protruding parts 8 is higher than abrasion resistance of the film 5. Accordingly, it is possible to suppress the generation of particles from the top surfaces 11 of the protruding parts 8 due to contact with the object 2. Therefore, it is possible to suppress contamination of the object 2 due to adhesion of the particles. Consequently, it is possible to provide the attachment member 1 that is excellent in attachment force for the object 2, and suppresses the contamination of the object 2.

The abrasion resistance of the top surfaces 11 of the protruding parts 8 is higher than the abrasion resistance of the film 5, and therefore abrasion of the top surfaces 11 of the protruding parts 8 due to the contact with the object 2 is suppressed. Consequently, it is possible to enhance evenness of the top surfaces 11 of the protruding parts 8. Consequently, it is possible to suppress distortion of the object 2 supported by the protruding parts 8, and to enhance treatment precision for the object 2.

As illustrated in FIG. 2 and FIG. 3, the film 5 of this embodiment also exposes the side surfaces 13 of the protruding parts 8. As a result, it is possible to easily repel the liquid 10 by the side surfaces 13 of the protruding parts 8 having higher water repellency than the film 5, and to suppress entering of the liquid 10 between the top surfaces 11 of the protruding parts 8 and the object 2. Consequently, it is possible to suppress the distortion of the object 2 supported by the protruding parts 8, and to enhance the treatment precision for the object 2.

Figure 3A:
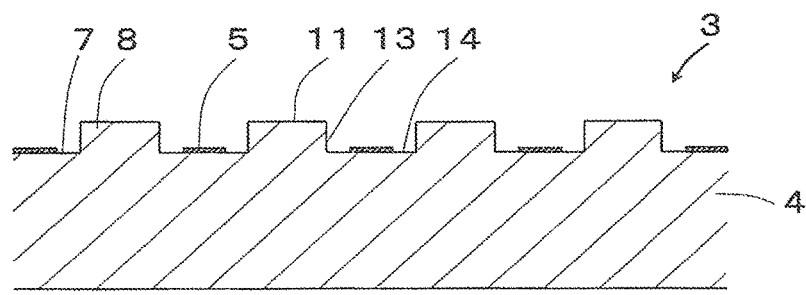
FIG. 3(a) is a partial enlarged view in FIG. 2(a)
Figure 3B:
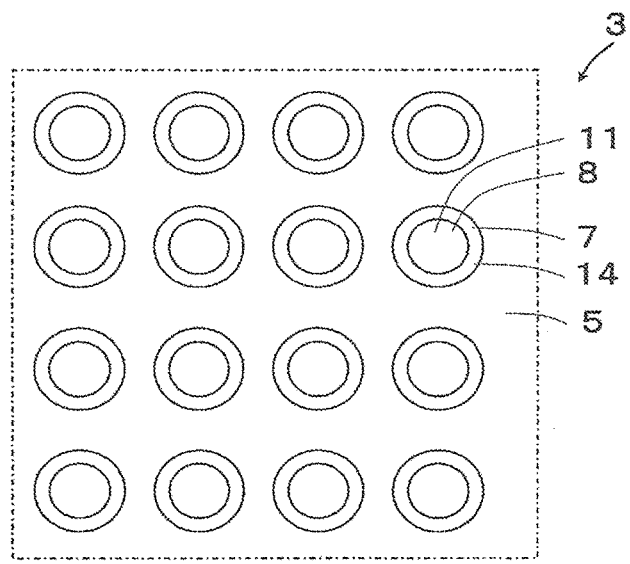
FIG. 3(b) is a partial enlarged view of a top view of the attachment member in FIG. 2(a).

Furthermore, as illustrated in FIG. 3(a) and FIG. 3(b), the film 5 of this embodiment exposes the side surfaces 13 of the protruding parts 8 in the circumferential directions of the protruding parts 8. As a result, it is possible to further suppress the entering of the liquid 10 between the top surfaces 11 of the protruding parts 8 and the object 2. In addition, the film 5 of this embodiment exposes the side surfaces 13 of the protruding parts 8 in the height directions of the protruding parts 8. That is, the film 5 exposes the whole side surfaces 13 of the protruding parts 8. As a result, it is possible to further suppress the entering of the liquid 10 between the top surfaces 11 of the protruding parts 8 and the object 2.

As illustrated in FIG. 3(a) and FIG. 3(b), the film 5 of the embodiment exposes vicinity regions 14 of the protruding parts 8 in the bottom surface 7. As a result, it is possible to easily repel the liquid 10 in the vicinity regions 14 of the protruding parts 8 in the bottom surface having higher water repellency than the film 5, and to suppress the entering of the liquid 10 between the top surfaces 11 of the protruding parts 8 and the object 2. Furthermore, the film 5 of the embodiment exposes the vicinity regions 14 of the protruding parts 8 in the bottom surface 7 in the circumferential directions of the protruding parts 8. As a result, it is possible to further suppress the entering of the liquid 10 between the top surfaces 11 of the protruding parts 8 and the object 2.

A distance between each protruding part 8 and the film 5 that exposes the vicinity region 14 is desirably not less than 50μm and not more than 150μm. As a result, while the entering of the liquid 10 between the top surfaces 11 of the protruding parts 8 and the object 2 is successfully suppressed, the hydrophilicity of the bottom surface 7 can be successfully enhanced by the film 5.

As illustrated in FIG. 3(a) and FIG. 3(b), the film 5 of the embodiment surrounds the plurality of protruding parts 8. That is, the film 5 has holes corresponding to the protruding parts 8, and the attachment surface 3 has a formation region of the film 5 that surrounds the protruding parts 8, and non-formation regions of the film 5 corresponding to the protruding parts 8. As a result, internal stress of the film 5 generated when the film 5 is formed is relaxed. Therefore, stress applied between the attachment surface 3 and film 5 is relaxed, so that it is possible to reduce peeling between the attachment surface 3 and the film 5. Furthermore, while the film 5 of the embodiment is separated from the protruding parts 8 in the bottom surface 7, the film 5 surrounds the protruding parts 8. As a result, it is possible to suppress the entering of the liquid 10 between the top surfaces 11 of the protruding parts 8 and the object 2. Additionally, it is possible to increase adhesive areas between the film 5 and the protruding parts 8 to suppress the peeling, and it is possible increase a region of the bottom surface 7, which is covered by the film 5, to successfully enhance the hydrophilicity of the bottom surface 7.

In this embodiment, arithmetic average roughness (Ra) of the top surfaces 11 of the protruding parts 8 is desirably smaller than arithmetic average roughness (Ra) of the bottom surface 7. As a result, it is possible to reduce surface roughness in the top surfaces 11 of the protruding parts 8, and to reduce particles generated by friction between the top surfaces 11 and the object 2. Additionally, it is possible to increase surface roughness of the bottom surface 7 to enhance adhesive strength between the bottom surface 7 and the film 5. In this embodiment, the top surface 11 is a ground surface, and the bottom surface 7 is a blasting surface. Consequently, the arithmetic average roughness (Ra) of the top surfaces 11 of the protruding parts 8 is smaller than the arithmetic average roughness (Ra) of the bottom surface 7. The arithmetic average roughness (Ra) of the top surface 11 is, for example, not less than 0.003μm and not more than 0.02μm. Additionally, the arithmetic average roughness (Ra) of the bottom surface 7 is, for example, not less than 0.3μm and not more than 6.3μm. The arithmetic average roughness (Ra) of each of the top surfaces 11 and the bottom surface 7 complies with JISB 0601: 2001, and can be measured by, for example, a surface roughness measuring machine manufactured by Kosaka Laboratory Ltd.

Now, a method for manufacturing the above attachment member 1 is described in detail with reference to FIG. 4 and FIG. 5.

Figure 4A:
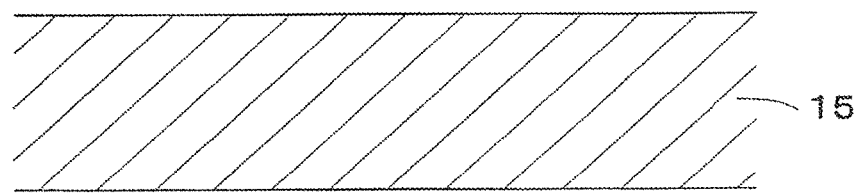
FIG. 4(a) to FIG. 4(c) each are a partial enlarged view of a sectional view cut in the thickness direction, illustrating a method for manufacturing the attachment member in FIG. 1.
Figure 4B:
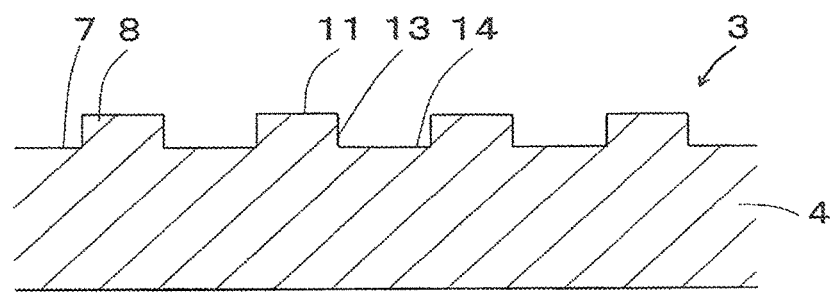

(1) As illustrated in FIG. 4(a) and FIG. 4(b), the base 4 is prepared. Specifically, for example, the base 4 is prepared as follows.

First, pure water and organic binder are added to ceramic powder, and are thereafter wet-blended by a ball mill, so that slurry is manufactured. Next, the slurry is granulated by spray-dry. Then, the granulated ceramic powder is molded, so that a molded body is manufactured. The molded body is cut to have a desired shape. This molded body is fired at, for example, not less than 1000° C. and not more than 2300° C., so that a sintered body is manufactured. This sintered body is cut to have a desired shape, so that a sintered body 15 for a base illustrated in FIG. 4(a) is obtained. This sintered body 15 for a base has a shape corresponding to the object 2. In this embodiment, the sintered body 15 has a disk-shape, but is not formed with the attachment surface 3.

A principal plane of the sintered body 15 for a base is polished by lapping, polishing, or the like, so that this principal plane becomes a ground surface. The lapping can be performed by using, for example, abrasive composed of diamond and the like, and a lapping machine composed of cast iron and the like. Then, masks for blast are disposed at places that become the protruding parts, and the principal plane of the sintered body 15 for a base is subjected to blast machining. Consequently, as illustrated in FIG. 4(b), the attachment surface 3 having the annular part 6, the bottom surface 7, and the protruding parts 8 is formed, so that the sintered body 15 for a base is used as the base 4. In this base 4, the top surfaces 11 of the protruding parts 8 become ground surfaces, and the bottom surface 7 becomes a blasting surface. When the attachment surface 3 is formed, ion beam machining may be used in place of blast machining.

Thus, the base 4 can be prepared.

(2) As illustrated in FIG. 4(c) to FIG. 5(c), the film 5 is formed on the attachment surface 3 of the base 4, so that the attachment member 1 is manufactured. Specifically, for example, the attachment member 1 is manufactured as follows.

Figure 4C:
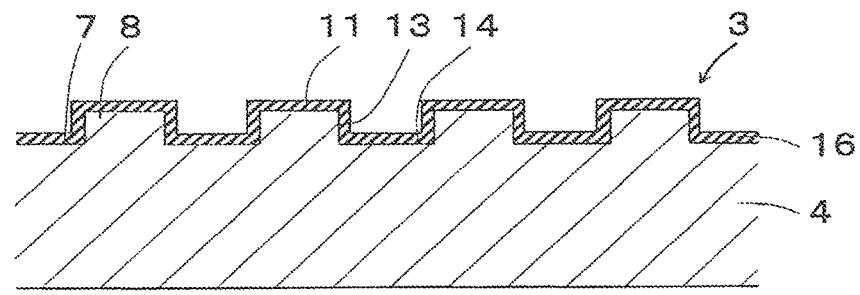
Figure 5A:
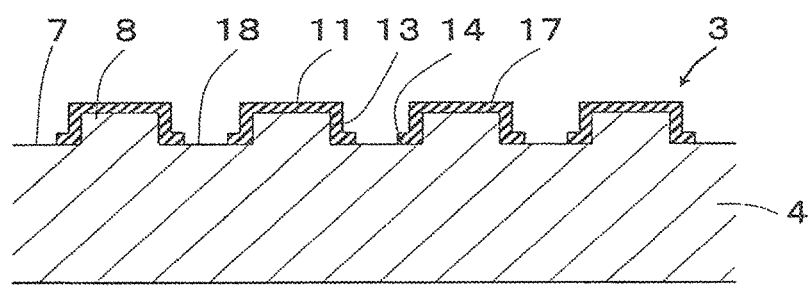
FIG. 5(a) to FIG. 5(c) each are a partial enlarged view of a sectional view cut in the thickness direction, illustrating a method for manufacturing the attachment member in FIG. 1.
Figure 5B:
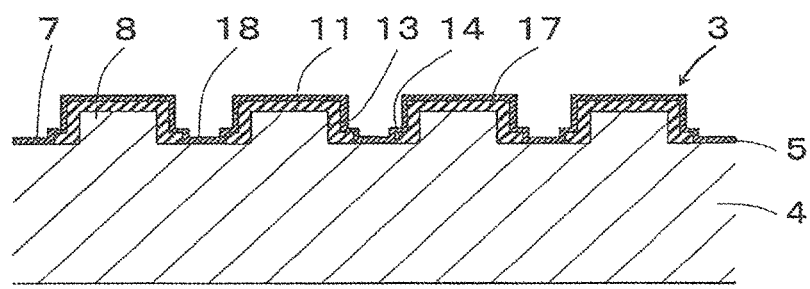
Figure 5C:
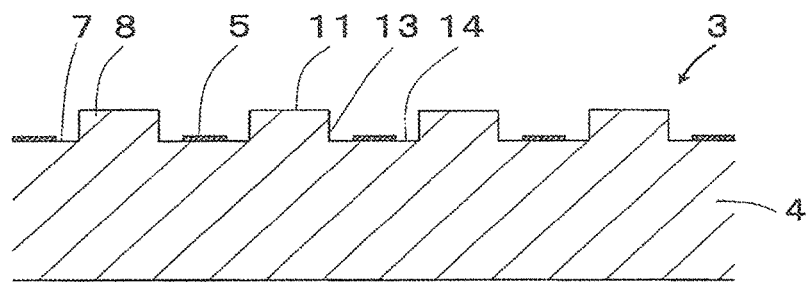

First, as illustrated in FIG. 4(c), resist 16 composed of photosensitive resin is applied on the bottom surface 7 and the protruding parts 8. Then, as illustrated in FIG. 5(a), the resist 16 is patterned by a photolithography method. Consequently, the top surfaces 11 and the side surfaces 13 of the protruding parts 8, and the vicinity regions 14 of the bottom surface 7 are covered, and mask 17 for film formation that exposes at least a part of the bottom surface 7 is formed. Regions exposed from this mask 17 for film formation are defined as exposed regions 18. As illustrated in FIG. 5(b), the film 5 is formed on the exposed regions 18 and the mask 17 for film formation by using a film formation method such as a PVD method, a CVD method, a deposition method, an ion plating method, and a sputtering method. Then, the mask 7 for film formation is mechanically peeled from the attachment surface 3, the film 5 on the mask 17 for film formation is removed, and the film 5 remains on the exposed regions 18, as illustrated in FIG. 5(c), Thus, at least the part of the bottom surface 7, namely, the exposed regions 18 are covered, and the film 5 that exposes the top surfaces 11 and the side surfaces 13 of the protruding parts 8, and the vicinity regions 14 of the bottom surface 7 is formed, so that the attachment member 1 illustrated in the figures can be manufactured.

<Second Embodiment>

Now, an attachment member according to a second embodiment of the present invention is described in detail with reference to FIG. 6. Description of configurations similar to configurations of the above first embodiment is omitted.

Figure 6A:
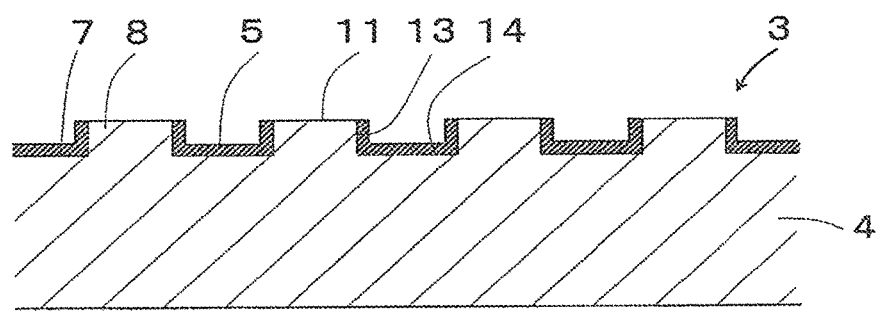
FIG. 6(a) is a partial enlarged view of a sectional view cut in a thickness direction of an attachment member according to a second embodiment of the present invention.

As illustrated in FIG. 6(a), an attachment member 1 of the second embodiment is different from the attachment member 1 of the first embodiment in a configuration of a film 5. The film 5 of this embodiment exposes top surfaces 11 of protruding parts 8, and covers side surfaces 13 of the protruding parts 8 and vicinity regions 14 of the protruding parts 8 in a bottom surface 7. As a result, it is possible to further suppress generation of bubbles in liquid 10 supplied to a space 9.

Figure 6B:
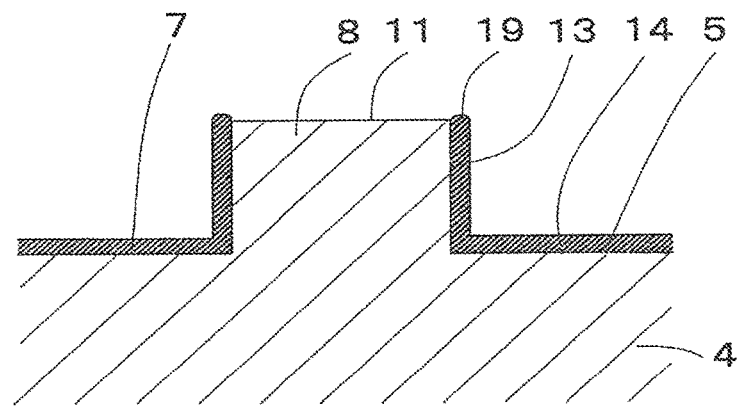
FIG. 6(b) is a partial enlarged view of FIG. 6(a)

As illustrated in FIG. 6(b), the film 5 of the embodiment has convex parts 19 formed by partially protruding parts of the film 5, which cover the side surfaces 13 of the protruding parts 8, from the top surfaces 11 of the protruding parts 8 toward a side opposite to the bottom surface 7. As a result, when an object 2 is placed on the protruding parts 8, a Young's modulus of each convex part 19 is lower than a Young's modulus of each protruding part 8, and the convex parts 19 elastically deform to relax stress applied to the object 2. Therefore, it is possible to suppress generation of cracks in the object 2. Additionally, when the object 2 is attached to the attachment surface 3, the convex parts 19 elastically deform, so that the object 2 comes into close contact with the protruding parts 8. Therefore, it is possible to suppress reduction in treatment precision for the object 2. The film 5 may not have the convex parts 19.

Figure 6C:
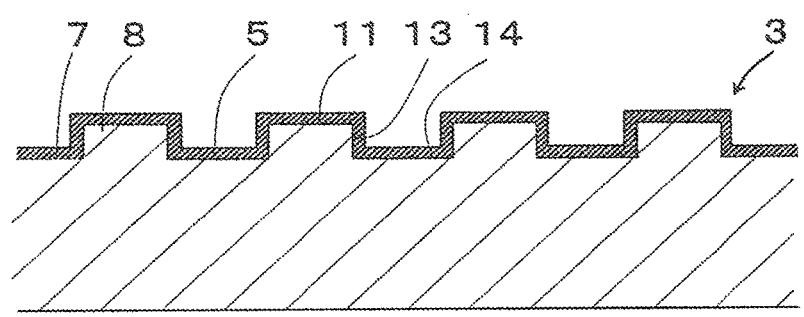
FIG. 6(c) is a partial enlarged view of a sectional view cut in a thickness direction, illustrating a method for manufacturing the attachment member in FIG. 6(a).

The film 5 of the embodiment can be formed as follows. First, a base 4 is prepared in a similar manner to the above process (1). As illustrated in FIG. 6(c), the film 5 are formed on the bottom surface 7, and the side surfaces 13 and the top surfaces 11 of the protruding parts 8, by using, a film formation method such as a PVD method, a CVD method, a deposition method, an ion plating method and a sputtering method. Then, the top surfaces 11 of the protruding parts 8 are polished. Consequently, parts of the film 5, which cover the top surfaces 11 of the protruding parts 8, are removed, so that the top surfaces 11 of the protruding parts 8 are exposed from the film 5. In a case where the film 5 is composed of silicon or silicon oxide, a Young's modulus of the film 5 is lower than the Young's modulus of each protruding part 8, and the film 5 elastically deforms, when the polishing is performed. Therefore, the parts of the film 5, which cover the side surfaces 13 of the protruding parts 8, partially protrude from the top surfaces 11 of the protruding parts 8 toward the side opposite to the bottom surface 7, so that the convex parts 19 can be formed. Particularly, when a polishing amount is increased, a polishing speed is increased, an average particle diameter of abrasive grains is increased at the time of polishing, the convex parts 19 can be successfully formed. Thus, it is possible to form the film 5 illustrated in FIG. 6(a) and FIG. 6(b).

The present invention is not limited to the above embodiments, and various changes, modifications, combinations, and the like may be performed without departing from the spirit of the present invention.

Figure 7:
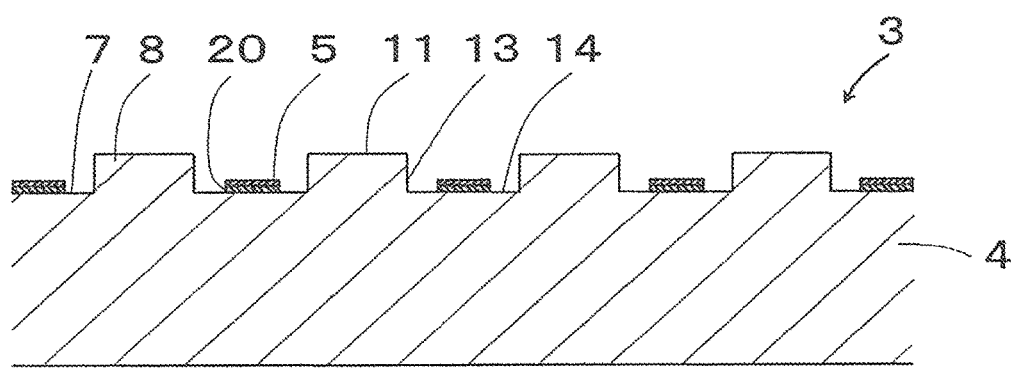
FIG. 7 is a partial enlarged view of a sectional view cut in a thickness direction of an attachment member according to another embodiment of the present invention.

The film 5 directly adhered to the bottom surface 7 in the above embodiments of the present invention, but the film 5 may cover at least a part of the bottom surface 7, for example. For example, as illustrated in FIG. 7, the attachment member 1 may further include an interposed layer 20 disposed between the film 5 and the bottom surface 7. In this case, the film 5 is desirably composed of silicon oxide, and the interposed layer 20 is desirably composed of silicon. As a result, it is possible to enhance adhesive strength between the film 5 composed of silicon oxide, and the bottom surface 7.

REFERENCE SIGNS LIST

1 Attachment member
2 Object
3 Attachment surface
4 Base
5 Film
6 Annular part
7 Bottom surface
8 Protruding part
9 Space
10 Liquid
11 Top surface of protruding part
12 Side surface of liquid
13 Side surface of protruding part
14 Vicinity region of protruding part in bottom surface
15 Sintered body for base
16 Resist
17 Mask for film formation
18 Exposed region
19 Convex part
20 Interposed layer

The invention claimed is:

1. An attachment member comprising:
a base composed of a ceramic sintered body, which has an annular part corresponding to a shape of an object, a bottom surface located inside the annular part, and a plurality of column shaped protruding parts protruding from the bottom surface, and is provided with an attachment surface supporting and attaching the object inside the annular part by a plurality of the protruding parts; and
a film that has higher hydrophilicity than the base, wherein the film is located on at least a part of the base and is not located on the top surface and the side surface of the protruding parts.

2. The attachment member according to claim 1, wherein the film is composed of silicon or silicon oxide.

3. The attachment member according to claim 1, wherein the film is composed of an inorganic substance.

4. The attachment member according to claim 3, wherein the film is composed of oxide.

5. The attachment member according to claim 1, wherein the film is not located on vicinity regions of the protruding parts in the bottom surface.

6. The attachment member according to claim 5, wherein the distance between the film and the protruding parts is 50 to 150 µm.

7. An attachment device comprising:
the attachment member according to claim 5; and
a liquid supply member that supplies liquid between the bottom surface of the attachment member and the object.

8. An attachment member comprising:
a base composed of a ceramic sintered body, which has an annular part corresponding to a shape of an object, a bottom surface located inside the annular part, and a plurality of column shaped protruding parts protruding from the bottom surface, and is provided with an attachment surface supporting and attaching the object inside the annular part by a plurality of the protruding parts; and
a film that is composed of silicon or silicon oxide, wherein the film is located on at least a part of the base and is not located on the top surface and the side surface of the protruding parts.

9. The attachment member according to claim 8, wherein the film is not located on vicinity regions of the protruding parts in the bottom surface.

10. The attachment member according to claim 9, wherein the distance between the film and the protruding parts is 50 to 150 µm.

11. An attachment device comprising:
the attachment member according to claim 9; and
a liquid supply member that supplies liquid between the bottom surface of the attachment member and the object.

* * * * *